US011768990B1

(12) United States Patent
Leder et al.

(10) Patent No.: US 11,768,990 B1
(45) Date of Patent: Sep. 26, 2023

(54) INTERCONNECT FLOW GRAPH FOR INTEGRATED CIRCUIT DESIGN

(71) Applicant: Amazon Technologies, Inc., Seattle, WA (US)

(72) Inventors: Uri Leder, Lotem (IL); Ori Ariel, Ma'ale Adumim (IL); Max Chvalevsky, Mevaseret Zion (IL); Benzi Denkberg, Etz Efraim (IL); Guy Nakibly, Kedumim (IL)

(73) Assignee: Amazon Technologies, Inc., Seattle, WA (US)

( * ) Notice: Subject to any disclaimer, the term of this patent is extended or adjusted under 35 U.S.C. 154(b) by 144 days.

(21) Appl. No.: 17/305,043

(22) Filed: Jun. 29, 2021

(51) Int. Cl.
*G06F 30/398* (2020.01)
*G06F 30/394* (2020.01)
(Continued)

(52) U.S. Cl.
CPC .......... *G06F 30/394* (2020.01); *G06F 30/331* (2020.01); *G06F 30/392* (2020.01); *G06F 30/398* (2020.01)

(58) Field of Classification Search
CPC ........ G06F 3/065; G06F 3/0673; G06F 30/23; G06F 30/27; G06F 30/327; G06F 7/44; G06F 7/485; G06F 7/49984; G06F 7/50; G06F 7/52; G06F 7/724; G06F 8/34; G06F 8/38; G06F 8/42; G06F 8/445; G06F 8/451; G06F 8/456; G06F 8/71; G06F 8/76; G06F 9/30007; G06F 9/30018; G06F 9/30058; G06F 9/3013; G06F 9/30145; G06F 9/3455; G06F 9/382; G06F 9/3828; G06F 9/3838; G06F 9/3855; G06F 9/3869; G06F 9/451; G06F 9/45533; G06F 9/466; G06F 9/485; G06F 9/5016; G06F 9/5033; G06F 9/5094; G06F 9/52; G06F 9/522; G06F 9/541; G06F 9/547; G06F 9/4881; G06F 9/5066; G06F 21/53; G06F 18/211; G06F 18/24323; G06F 2209/506; G06F 18/24; G06F 18/213; G06F 9/5027; G06F 18/2163; G06F 18/22; G06F 21/64; G06F 9/30036; G06F 9/5044; G06F 16/535; G06F 16/538; G06F 16/54; G06F 16/951; G06F 17/16; G06F 18/21; G06F 18/24143; G06F 21/44; G06F 21/45; G06F 21/6254; G06F 2209/503; G06F 2221/2117; G06F 9/5072; G06F 9/3001; G06F 9/5077; G06F 15/8046; G06F 18/217; G06F 18/214; G06F 9/3836; G06F 7/5443; G06F 9/3887; G06F 9/30014;
(Continued)

(56) References Cited

U.S. PATENT DOCUMENTS

2016/0274187 A1\* 9/2016 Menon ................ G06F 11/3648
2019/0227979 A1\* 7/2019 Ganesh ............... G06F 15/7825
2021/0152494 A1\* 5/2021 Johnsen ............. H04L 47/2433

\* cited by examiner

*Primary Examiner* — Binh C Tat
(74) *Attorney, Agent, or Firm* — Weaver Austin Villeneuve & Sampson LLP

(57) ABSTRACT

An integrated circuit design technique utilizes a data structure describing the connections, interconnect routing information of the connections, and bandwidth requirements of the connections in an integrated circuit device to generate an interconnect flow graph having nodes, and edges connecting the nodes. The edges connecting the nodes can reflect the bandwidth requirements of the connections. The interconnect flow graph can be used to optimize and verify the integrated circuit design.

18 Claims, 10 Drawing Sheets

(51) Int. Cl.
*G06F 30/331* (2020.01)
*G06F 30/392* (2020.01)

(58) Field of Classification Search
CPC .... G06F 9/3004; G06F 9/30047; G06F 9/383; G06F 9/30076; G06F 9/3814; G06F 9/5083; G06F 17/18; G06F 18/241; G06F 2212/302; G06F 2212/401; G06F 9/3842; G06F 9/3851; G06F 9/3863; G06F 9/3877; G06F 18/24133; G06F 21/604; G06F 21/6245; G06F 9/30087; G06F 9/3009; G06F 9/3016; G06F 9/30181; G06F 9/30189; G06F 9/3834; G06F 9/3857; G06F 9/3859; G06F 9/4411; G06F 9/45504; G06F 9/48; G06F 9/505; G06F 12/0806; G06F 3/013; G06F 7/57; G06F 9/3802; G06F 9/545; G06F 12/0215; G06F 12/023; G06F 12/0238; G06F 12/0246; G06F 12/0607; G06F 12/0802; G06F 12/0804; G06F 12/0811; G06F 12/0862; G06F 12/0866; G06F 12/0871; G06F 12/0875; G06F 12/0882; G06F 12/0891; G06F 12/0893; G06F 12/0895; G06F 12/0897; G06F 12/1009; G06F 12/12; G06F 12/128; G06F 15/16; G06F 15/173; G06F 15/7839; G06F 16/24532; G06F 16/24569; G06F 16/27; G06F 16/9024; G06F 2212/1016; G06F 2212/1021; G06F 2212/1024; G06F 2212/1044; G06F 2212/2542; G06F 2212/455; G06F 2212/60; G06F 2212/601; G06F 2212/6026; G06F 2212/6028; G06F 2212/608; G06F 2212/652; G06F 7/483; G06F 7/575; G06F 7/58; G06F 7/588; G06F 9/30043; G06F 9/30065; G06F 9/30079; G06F 9/3012; G06F 9/3818; G06F 9/3867; G06F 9/3891; G06F 9/50; G06F 9/5011; G06F 9/5061; G06F 15/80; G06F 15/8053; G06F 18/2148; G06F 18/2415; G06F 2009/45583; G06F 2207/4824; G06F 7/523; G06F 7/78; G06F 8/40; G06F 8/433; G06F 8/443; G06F 8/4441; G06F 8/65; G06F 9/00; G06F 9/30; G06F 9/30054; G06F 9/30101; G06F 9/355; G06F 9/3552; G06F 9/3853; G06F 9/3893; G06F 9/45558; G06F 9/54; G06F 9/544; G06F 1/10; G06F 1/20; G06F 11/302; G06F 13/4027; G06F 15/8007; G06F 16/3329; G06F 18/2113; G06F 18/21347; G06F 18/2193; G06F 18/2411; G06F 18/2413; G06F 18/2431; G06F 18/2433; G06F 18/25; G06F 2009/45579; G06F 2009/45587; G06F 21/105; G06F 21/602; G06F 21/84; G06F 21/86; G06F 3/011; G06F 3/0481; G06F 3/04815; G06F 3/0604; G06F 12/0888; G06F 2212/1008; G06F 1/184; G06F 1/185; G06F 12/0207; G06F 12/0842; G06F 13/1621; G06F 13/1668; G06F 15/7896; G06F 18/19; G06F 2009/45595; G06F 3/064; G06F 7/08; G06F 8/20; G06F 8/30; G06F 8/452; G06F 8/72; G06F 9/30105; G06F 9/5022; G06F 2224/48227; G06F 2224/4824; G06F 2225/0651; G06F 2924/15311; G06F 2924/1532; G06F 23/49838; H01L 22/32; H01L 2224/16225; H01L 2224/16227; H01L 2224/48091; H01L 2224/48227; H01L 2224/4824; H01L 2225/0651; H01L 2225/06513; H01L 2225/06527; H01L 2225/06541; H01L 23/49838; H01L 23/573; H01L 25/18; H01L 2924/00014; H01L 2924/15153; H01L 2924/15157; H01L 2924/15192; H01L 2924/15311; H01L 2924/1532

USPC .................................................. 716/126–131

See application file for complete search history.

| src \ tar: | Cmp-0 | Cmp-1 | Cmp-2 | Cmp-3 | ... | IC-0 | ... |
|---|---|---|---|---|---|---|---|
| Cmp-0 |  |  |  |  |  |  |  |
| Cmp-1 | local |  |  | remote |  |  |  |
| Cmp-2 | local | remote |  | local |  |  |  |
| ... |  |  |  |  |  |  |  |
| Cmp-n | local | local | both | both |  | local |  |
| IC-0 | local |  | local | local |  |  |  |
| IC-1 |  |  |  |  |  |  |  |
| ... |  |  |  |  |  |  |  |
| IC-n |  |  |  |  |  |  |  |

FIG. 5

| tar:\src: | Cmp-0 | Cmp-1 | Cmp-2 | Cmp-3 | ... | IC-0 | ... |
|---|---|---|---|---|---|---|---|
| Cmp-0 |  |  |  |  |  |  |  |
| Cmp-1 | 10GB/s | 25GB/s | 20GB/s | 20GB/s |  |  |  |
| Cmp-2 |  |  | 25GB/s |  |  |  |  |
| ... |  |  |  |  |  |  |  |
| Cmp-n | 20GB/s |  | 10GB/s | 10GB/s |  |  |  |
| IC-0 | 40GB/s | 40GB/s | 40GB/s | 40GB/s |  | 5GB/s |  |
| IC-1 |  |  |  |  |  |  |  |
| ... |  |  |  |  |  |  |  |
| IC-n |  |  |  |  |  |  |  |

INTERCONNECT FLOW GRAPH FOR INTEGRATED CIRCUIT DESIGN

BACKGROUND

Integrated circuit devices are becoming more complex to meet the ever-increasing performance demands. Integrated circuits such as system-on-chips (SoCs) incorporate various functional circuit blocks into a single chip to support a wide variety of functions. To further increase computing throughput, multiple SoCs can also be integrated together. As the number of components integrated together increases, the number of data communication channels used to exchange data between the components also increases. For example, a complex multi-SoC device can have hundreds of data communication channels within the device to support data exchange between the numerous functional circuit blocks of the device.

BRIEF DESCRIPTION OF THE DRAWINGS

Various embodiments in accordance with the present disclosure will be described with reference to the drawings, in which:

FIG. 5 illustrates an example of a connectivity data structure, according to certain aspects of the disclosure;

FIG. 8 illustrates an example of a bandwidth routing data structure, according to certain aspects of the disclosure;

DETAILED DESCRIPTION

Figure 1:
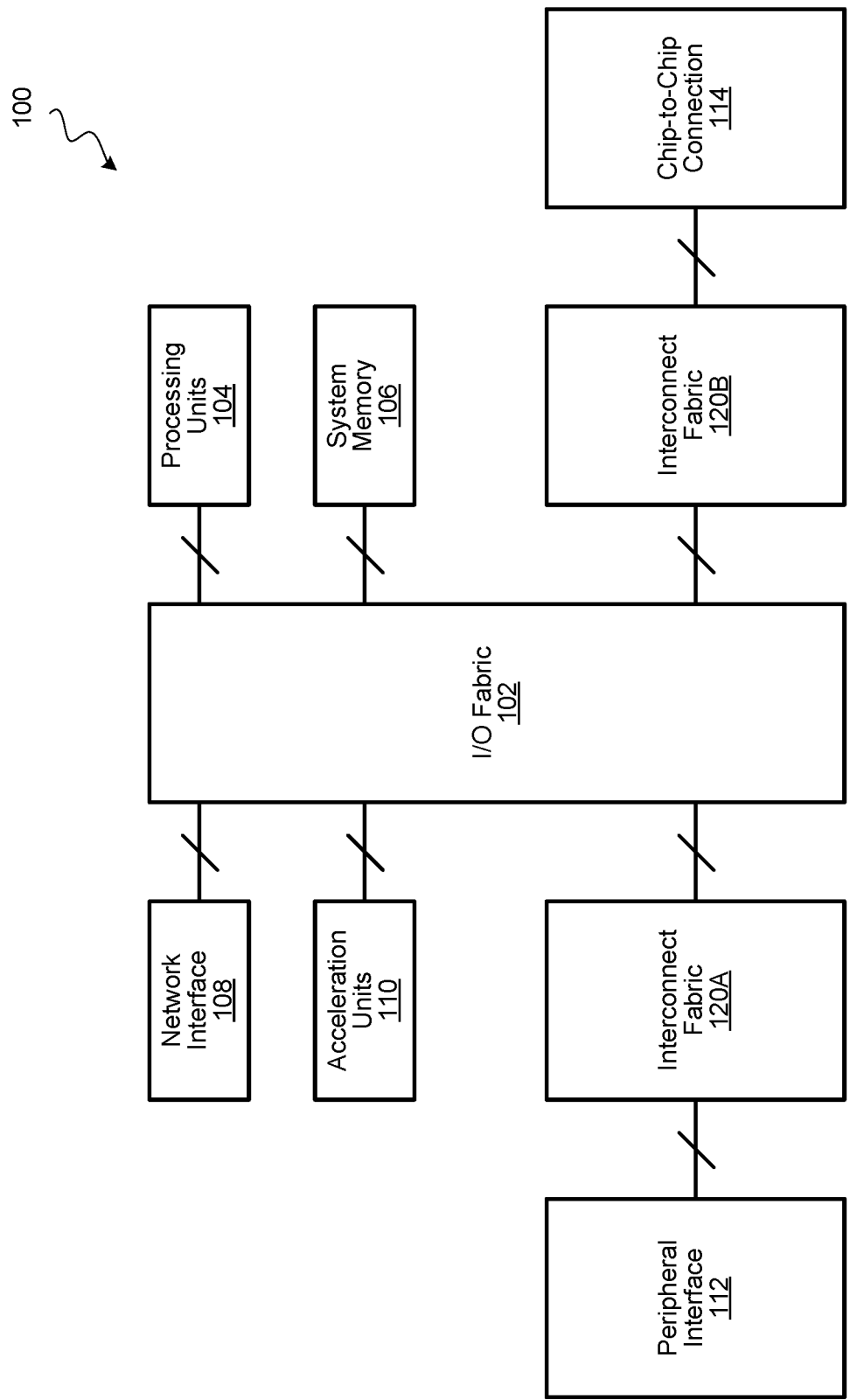
FIG. 1 illustrates a block diagram of an example of a system-on-chip, according to certain aspects of the disclosure.

Various functional blocks or endpoints in single chip or multi-chip devices can exchange data with each other via communication channels using protocols such as Advanced eXtensible Interface (AXI), Peripheral Component Interconnect (PCI), or the like. Some communication channels can have multiple branches, and some endpoints can be connected to multiple other endpoints. Between connected endpoints, the traffic may flow in various rates. Moreover, in some cases, the traffic from one endpoint to another endpoint may travel via one or more intermediate points, and some intermediate points can also be used as an intermediate point for other endpoints.

During the design phase of a single chip or multi-chip device, communication channels or connections used to exchange data between endpoints are defined. For example, a connection can be defined by the endpoints (e.g., a source port and a target port), any intermediate points (e.g., an interconnect port) between the endpoints, and the amount of traffic (e.g., communication bandwidth) transmitted between each pair of points. Each point along the connection may have a limit as to the maximum amount of traffic that can be carried. For example, an AXI connection point may have a maximum bandwidth of 250 Gb/s. As such, verifying the traffic traversing through each connection point during the design phase of the integrated circuit device can help avoid interconnect bottlenecks and deadlocks. However, as more and more components are integrated together, the interconnectivity of the integrated circuit device becomes increasingly complex, which in turn complicates the connection bandwidth verification task.

The techniques disclosed herein provide a scalable mechanism to verify communication channel bandwidth in an integrated circuit device. The verification technique can be used as an electronic design automation (EDA) tool to verify a single chip device such as a system-on-chip (SoC), or multi-chip devices having two or more interconnected chips. According to some implementations, the verification technique receives a data structure (e.g., one or more tables) describing the connections, interconnect routing information of the connections, and bandwidth requirements of the connections in the integrated circuit device. The endpoints and intermediate points of the connections can be converted into nodes of an interconnect flow graph, and edges connecting the nodes of the interconnect flow graph can reflect the bandwidth requirements of the connections. The bandwidth utilization of each node can be computed as the sum of the bandwidth of the incoming edges to that node, and the bandwidth utilization of the node can be compared with a bandwidth constraint to determine if the node can support the required bandwidth of the design. Nodes that may not be able to meet the required bandwidth of the design can be reported such that the interconnectivity of the communication channels can be adjusted to reroute some of the data flow from the problematic nodes to other nodes to avoid deadlocks and bottlenecks. In addition to avoiding deadlocks and bottlenecks, the verification technique can also be used to load balance the communication bandwidth in the integrated circuit design by moving bandwidth from high utilization nodes to low utilization nodes.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates a block diagram of an example of a system-on-chip (SoC) 100, according to some implementations. SoC 100 may include an I/O fabric 102 that is used to facilitate data communication between the various components of SoC 100. I/O fabric 102 can be implemented, for example, using a protocol such as AXI. SoC 100 can include various functional circuit blocks such as one or more processing unit(s) 104 (e.g., processor, microcontroller, etc.), system memory 106 (e.g., DRAM, SRAM, flash memory, 3DXP, etc.), network interface controller 108 (e.g., Ethernet controller, etc.), and/or one or more acceleration unit(s) 110 (e.g., graphics processing unit, digital signal processor, tensor processing unit, etc.). Each of the functional circuit blocks may connect to I/O fabric 102 using one or more communication channels or communication ports. For example, processing unit(s) 104 may communicate with I/O fabric 102 using four processor communication ports, system memory 106 may communicate with I/O fabric 102 using eight system memory ports, network interface controller 108 may communicate with I/O fabric 102 using four network interface ports, and acceleration unit(s) may communicate with I/O fabric 102 using two accelerator communication ports.

SoC 100 may also include one or more interconnect fabrics to provide connectivity to peripheral devices, and/or to other chips in a multi-chip design. For example, SoC 100 may include interconnect fabrics 120A and 120B, which can be implemented using a protocol such as PCI or a derivative (e.g., PCI express, etc.). Interconnect fabric 120A can be used to facilitate data communications between I/O fabric 102 and one or more peripheral devices coupled to peripheral interface 112. Interconnect fabric 120B can be used to facilitate data communications between I/O fabric 102 and one or more additional integrated circuit chips coupled to chip-to-chip connection 114.

Each of the interconnect fabric 120A and 120B may connect to I/O fabric 102 using one or more communication channels or communication ports. For example, interconnect fabric 120A may communicate with I/O fabric 102 using four interconnect ports, and interconnect fabric 120B may communicate with I/O fabric 102 using five interconnect ports. Similarly, interconnect fabric 120A may communicate with peripheral interface 112 using four peripheral communication ports, and interconnect fabric 120B may communicate with chip-to-chip connection 114 using five chip-to-chip connection ports.

It should be noted that the communication ports used in SoC 100 can include communication ports that support different data transmission bandwidth. For example, a processor communication port may support a data transmission bandwidth of 100 GB/s, whereas a peripheral communication port may support a data transmission bandwidth of 4 GB/s. Furthermore, the same type of communication port may also support different data transmission bandwidths. For example, one system memory port may support 25 GB/s while another system memory port may support 50 GB/s. Moreover, each communication port may also support the same or different data transmission bandwidth for read and write accesses.

Each of the communication ports in SoC 100 can be used an endpoint of a connection (e.g., source port or target port) for data transmission in the integrated circuit design. Some of the communication ports can also be used as an intermediate point along an interconnect route for a connection. For example, to exchange data between a processor and a peripheral, a processor communication port can act as a source port and a peripheral communication port can act as a target port for the connection. An interconnect port can be an intermediate point for the connection such that data flows from the processor communication port to the interconnect port, and then from the interconnect port to the peripheral communication port. A particular communication port can also act as both a source port and a target port. For example, an accelerator communication port can be a target port in a processor to accelerator connection, and the same accelerator communication port can be a source port in an accelerator to system memory connection. In some implementations, a communication port can act as a source port, a target port, or an intermediate port depending on the connection.

Figure 2:
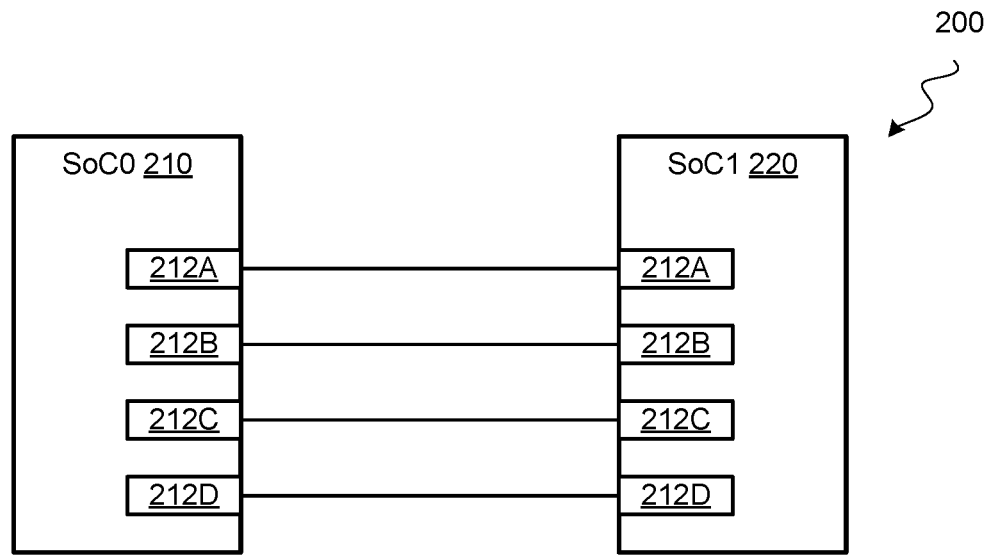
FIG. 2 illustrates a block diagram of an example of a multi-chip integrated circuit, according to certain aspects of the disclosure.

FIG. 2 illustrates an example of a multi-chip integrated circuit device 200. In the example shown, integrated circuit device 200 includes a first SoC0 210 coupled to a second SoC1 220. Each of SoC0 210 and SoC1 220 may include four chip-to-chip connection ports (e.g., SoC-to-SoC connection ports) that can be used for data communication with other chips. For example, chip-to-chip connection port 212A of SoC0 210 can be connected to chip-to-chip connection port 222A of SoC1 220; chip-to-chip connection port 212B of SoC0 210 can be connected to chip-to-chip connection port 222B of SoC1 220; chip-to-chip connection port 212C of SoC0 210 can be connected to chip-to-chip connection port 222C of SoC1 220; and chip-to-chip connection port 212D of SoC0 210 can be connected to chip-to-chip connection port 222D of SoC1 220.

In some implementations, SoC0 210 and SoC1 220 can be symmetric (e.g., having identical or similar architecture), and may be implemented using a SoC architecture such as SoC 100. Chip-to-chip connection ports 212A-D can be coupled to an interconnect fabric of SoC0 210, and chip-to-chip connection ports 222A-D can be coupled to an interconnect fabric of SoC1 220. Within each of SoC 210 and SoC1 220, a set of connections can be defined to allow some or all of the source ports of a SoC to exchange data with the other chip. For example, a connection can be defined to route data from a processor communication port of SoC0 210 to chip-to-chip connection port 212B to communicate with SoC1 220. Because of the limited number of chip-to-chip connection ports, a particular chip-to-chip connection port may support connections to multiple source ports. Similarly, a particular chip-to-chip connection port at the target chip may support connections to multiple target ports.

Certain source ports and/or target ports may not have direct access to the chip-to-chip connection ports. For example, a processor communication port can be part of a northbridge interface and the chip-to-chip connection ports can be part of a southbridge interface. Data transmission from a processor communication port may have to be routed through the southbridge interface via an intermediate interconnect port to reach the chip-to-chip connection port. As such, connections from a source port to a chip-to-chip connection port may include an intermediate interconnect port.

In some implementations, SoC0 210 and SoC1 220 can be asymmetric and need not have the same or similar architecture. For example, SoC0 210 can have certain functional blocks that are not included in SoC1 220, and/or SoC1 220 can have certain functional blocks that are not included in SoC0 210. Furthermore, the interconnect techniques can also be applied to other chip-to-chip connection where one or both chips are not SoCs.

Figure 3:
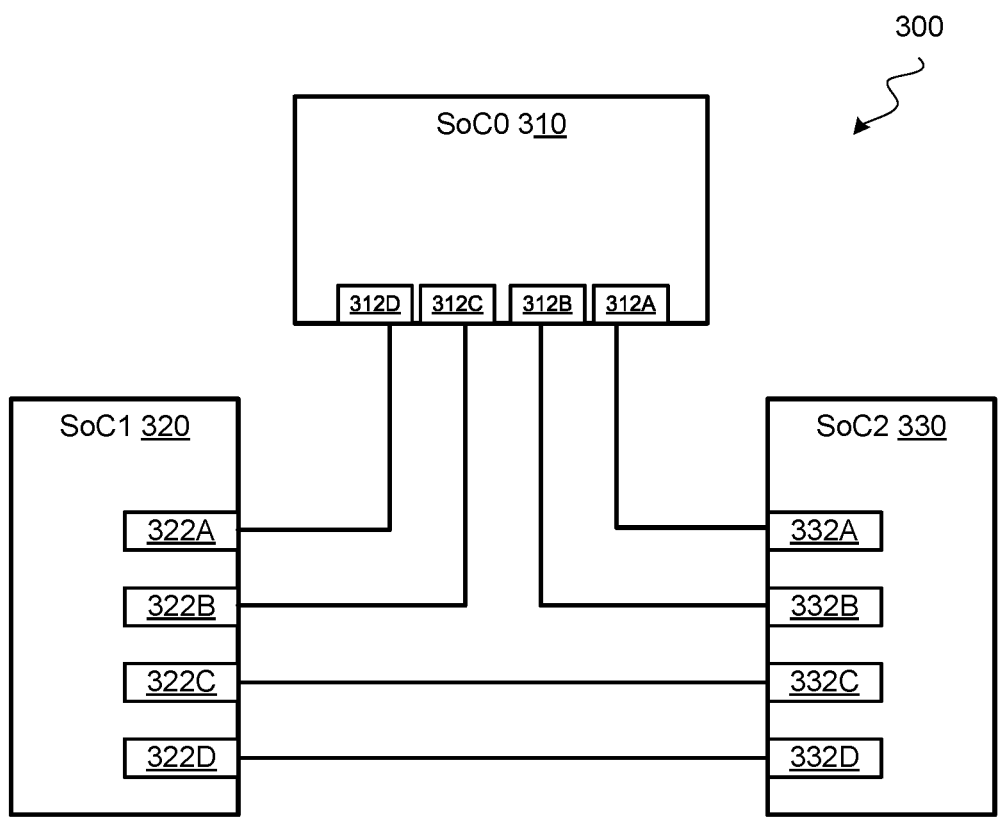
FIG. 3 illustrates a block diagram of another example of a multi-chip integrated circuit, according to certain aspects of the disclosure.

FIG. 3 illustrates another example of a multi-chip integrated circuit device 300. In the example shown, integrated circuit device 300 includes a first SoC0 310, a second SoC1 320, and a third SoC2 330 interconnected with each other. Similar to multi-chip integrated circuit device 200, each of the SoCs may include four chip-to-chip connection ports (e.g., SoC-to-SoC connection ports) that can be used for data communication with other chips. For example, chip-to-chip connection port 312A of SoC0 310 can be connected to chip-to-chip connection port 332A of SoC2 330; chip-to-chip connection port 312B of SoC0 310 can be connected to chip-to-chip connection port 332B of SoC2 320; chip-tochip connection port 312C of SoC0 310 can be connected to chip-to-chip connection port 322B of SoC1 320, chip-to-chip connection port 312D of SoC0 310 can be connected to chip-to-chip connection port 322A of SoC1 320; chip-to-chip connection port 322C of SoC1 320 can be connected to chip-to-chip connection port 332C of SoC2 330, and chip-to-chip connection port 322D of SoC1 320 can be connected to chip-to-chip connection port 332D of SoC2 330.

Although SoC0 310 is shown as using two chip-to-chip connection ports to communicate with SoC1 320 and two chip-to-chip connection ports to communicate with SoC2 330, the number of chip-to-chip connection coupled to a particular chip can be different depending on the data transmission bandwidth of the design. For example, if a higher bandwidth is required for the communication between SoC0 310 and SoC1 320, three chip-to-chip connection ports can be used to couple SoC0 310 with SoC1 320, and one chip-to-chip connection port can be used to couple SoC0 310 with SoC2 330. Furthermore, any number of the SoCs in multi-chip integrated circuit device 300 can be symmetric or asymmetric, and the interconnect techniques can also be applied to other chip-to-chip connections where one or more chips are not SoCs. It should also be understood that in other implementations, a multi-chip integrated circuit device can have additional number of chips interconnected with each other, and that not every chip in the device needs to be interconnected with every other chip.

Figure 4:
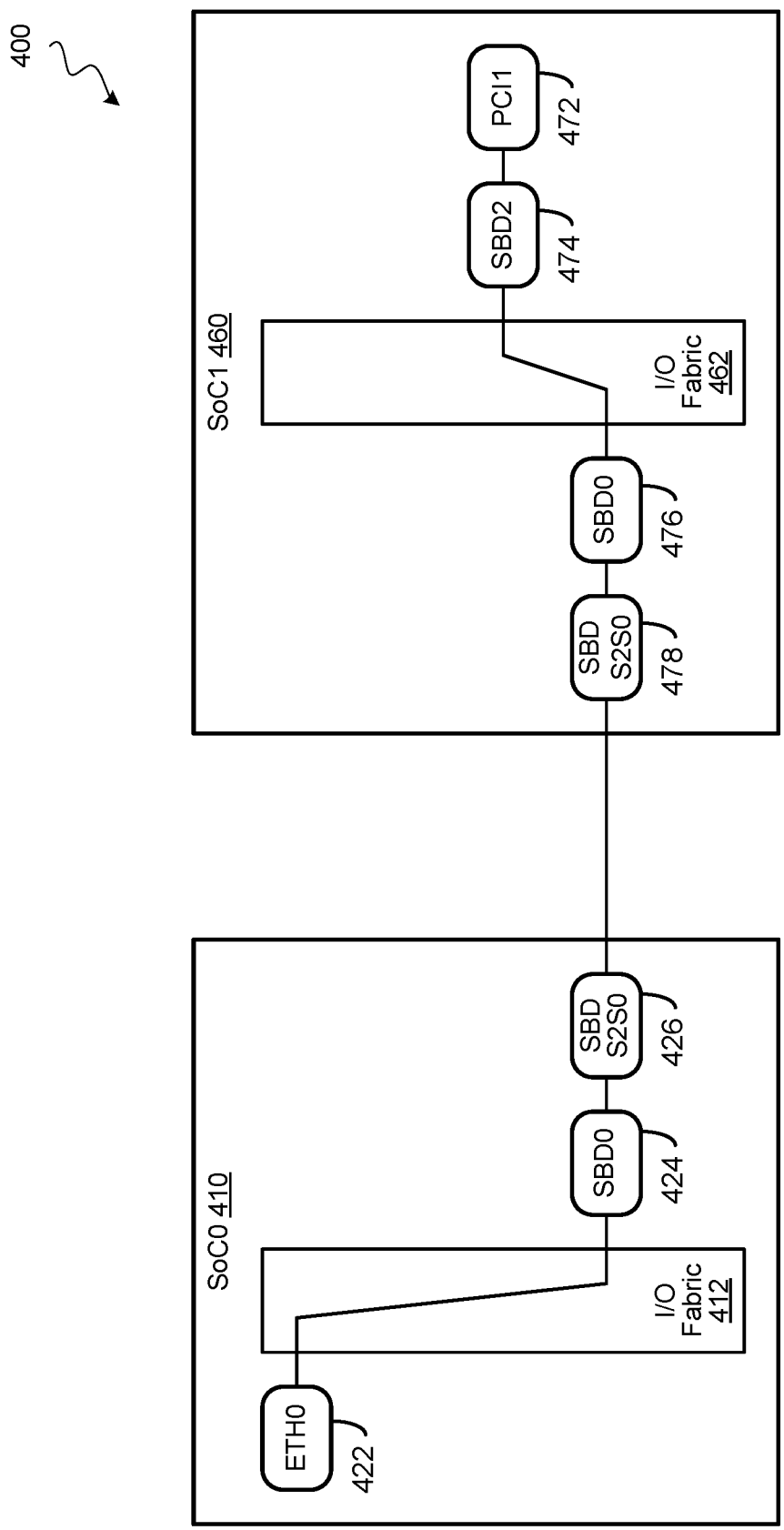
FIG. 4 illustrates an example of a communication channel in a multi-chip integrated circuit, according to certain aspects of the disclosure.

FIG. 4 illustrates an example of a connection for chip-to-chip communication in a multi-chip integrated circuit device 400. Multi-chip integrated circuit device 400 may include a SoC0 410 and a SoC1 460. SoC0 410 can be symmetrical with SoC2 460, and both SoCs may have a similar architecture as SoC 100. However, it should be understood that in some implementations, the two SoCs can be asymmetrical and may have a different architecture than SoC 100.

In the example shown, SoC0 410 communicates with SoC1 460 via a southbridge SoC-to-SoC connection port 0 (SBD_S2S0) 426 of SoC0 410, which is connected to a similar southbridge SoC-to-SoC connection port 0 (SBD_S2S0) 478 of SoC1 460. The southbridge SoC-to-SoC connection port is an example of a chip-to-chip connection port.

Ethernet port 0 (ETH0) 422, which is a network interface port of SoC0 410, is an initiator communicating with PCI port 1 (PCI1) 472, which is a peripheral communication port of SoC1 460. Within SoC0 410, SBD_S2S0 426 is connected to a southbridge interconnect port 0 (SBD0) 424. In order for ETH0 422 to communicate off-chip to SoC1 460, the data flow is routed via I/O fabric 412 through SBD0 424 to SBD_S2S0 426. Thus, in SoC0 410, a connection can be defined with ETH0 422 as a source port and SBD_S2S0 426 as a target port, and with the interconnect routing information that the data flow is routed through an intermediate interconnect port SBD0 424.

Within SoC1 460, SBD_S2S0 478 is connected to a southbridge interconnect port 0 (SBD0) 476, and PCI1 472 is connected to another southbridge interconnect port 2 (SBD2) 474. In order for data at SBD_S2S0 478 to reach PCI1 472, the data flow is routed through SBD0 476 via I/O fabric 462 to SBD2 474, and then to PCI1 472. Thus, in SoC1 460, a connection can be defined with SBD_S2S0 478 as a source port and PCI1 472 as a target port, and with the interconnect routing information that the data flow is routed through an intermediate interconnect ports SBD0 476 and SBD2 474.

The design of integrated circuit device 400 may designate a certain data transmission bandwidth to transfer data from ETH0 422 to PCI1 472. As can be seen, the data flow traverses through various intermediate points. Some of the intermediate points such as SBD0 424, SBD_S2S0 426, SBD_S2S0 478, SBD0 476, and SBD2 474 can be utilized by multiple source, target, and/or intermediate ports. As such, to avoid deadlocks and bottlenecks, the potential maximum bandwidth carried by each communication port is verified against a bandwidth constraint to ensure that the communication port can support the data bandwidth of the design of integrated circuit device 400.

To facilitate the design of the interconnect network of an integrated circuit device, a data structure can be used to describe the connections, interconnect routing information, and bandwidth requirements of the communication channels in the integrated circuit device. It should be noted that the term "a data structure" can refer to one or more data structures which can be stored in one or more files. Examples of data structures may include tables, arrays, spreadsheets, lists and/or linked lists, entries in a database, etc. Hence, a data structure may include one or more of any of these examples. In some implementations, a data structure may include a combination of different types of data structures. Furthermore, a data structure can be stored using a one or more files. For example, when a data structure includes multiple tables, each table can be stored in a separate file, or some or all of the tables can be combined and be stored in a single file.

FIG. 5 illustrates an example of a connectivity data structure 500 that can be used to indicate connections for data communication between source ports and target ports of an integrated circuit design. Although connectivity data structure 500 is represented as a table in FIG. 5, it should be understood that the connectivity information provided by connectivity data structure 500 can be represented using a different form of data structure.

In the example shown in FIG. 5, communication ports that can act as a source port in a chip are provided on the first column, with each source port being the first element of the different rows of connectivity data structure 500. The source ports of a chip may include communication ports that are associated with functional circuit blocks (e.g., Cmp-0 to Cmp-n) and communication ports that are associated with interconnect ports (e.g., IC-0 to IC-n). Examples of communication ports that are associated with functional circuit blocks (Cmp-0 to Cmp-n) can include processor communication ports, accelerator communication ports, system memory ports, network interface ports, peripheral communication ports, etc. Examples of communication ports that are associated with interconnect ports (IC-0 to IC-n) can include interconnect ports inside a chip, chip-to-chip connection ports, etc.

Communication ports that can act as a target port in a chip are provided on the first row, with each target port being the first element in the different columns of connectivity data structure 500. The target ports of a chip may include communication ports that are associated with functional circuit blocks (e.g., Cmp-0 to Cmp-n) and communication ports that are associated with interconnect ports (e.g., IC-0 to IC-n). It should be noted that some communication ports may act as both a source port and a target port, and some communication ports may act as a source port only or as a target port only.

As shown in FIG. 5, not all cells in connectivity data structure 500 are populated, and only valid connections may have a populated cell. By way of example, referring to the row having Cmp-0 as the source port, Cmp-0 does not act as a source port to transfer data with Cmp-0 or Cmp-1 as target ports in the integrated circuit design. As such, these cells in connectivity data structure 500 are not populated. Cmp-0 does act as a source port to transfer data with Cmp-2 as the target port on the local chip (e.g., the same chip as Cmp-0). As such, this cell is designated as "local" to indicate a local connection between Cmp-0 and Cmp-2 on the same chip. Cmp-0 also acts as a source port to transfer data with Cmp-3 as the target port on another chip but not Cmp-3 on the same chip. As such, this cell is designated as "remote" to indicate a connection between Cmp-0 of the local chip and Cmp-3 on a different chip.

As another example, referring to the row having Cmp-1 as the source port, Cmp-1 acts as a source port to transfer data with Cmp-0 as the target port on the local chip (e.g., the same chip as Cmp-1). As such, this cell is designated as "local" to indicate a local connection between Cmp-1 and Cmp-0 on the same chip. Cmp-1 also acts as a source port to transfer data with Cmp-1 as the target port on a different chip. As such, this cell is designated as "remote" to indicate a connection between Cmp-1 of the local chip and Cmp-1 on a different chip. Cmp-1 does not act as a source port to transfer data with Cmp-2 or Cmp-3 as target ports in the integrated circuit design. As such, these cells in connectivity data structure 500 are not populated. Cmp-1 also acts as a source port to transfer data with IC-0 on the same chip. As such, this cell is designated as "local" to indicate a connection between Cmp-1 and IC-0 on the same chip.

Certain communication ports can also act as a source port for a target port on both the local chip and a different chip. For example, referring to the row having Cmp-n as the source port, Cmp-n can act as a source port for Cmp-2 and Cmp-3 as the target port on both the local chip and a different chip. As such, these cells are designated as "both" to indicate a connection between Cmp-n of the local chip to Cmp-2 on the same and different chip, and a connection between Cmp-n of the local chip to Cmp-3 on the same and different chip.

In some implementations, connectivity data structure 500 can be flattened such that each source port of each chip has its own row heading, and each target port of each chip has its own column heading. For example, there can be one row heading with "Cmp-0-0" to indicate Cmp-0 of chip-0 as one source port, and another row heading with "Cmp-0-1" to indicate Cmp-0 of chip-1 as another source port. In such implementations, it is not necessary to indicate whether a connection is local, remote, or both, because separate cells are used to indicate the local and remote connections. A flattened connectivity data structure can also be used for multi-chip integrated circuit designs that have asymmetrical chips because there can be certain communication ports that are present in one chip but not another.

In some implementations, connectivity data structure 500 can be used in single chip integrated circuit designs. In such implementations, it is not necessary to indicate whether a connection is remote or both, because only local connections are defined.

Figure 6:
FIG. 6 illustrates an example of a routing data structure for chip-to-chip communication, according to certain aspects of the disclosure.

As described above a connectivity data structure (e.g., connectivity data structure 500) provides information indicating the endpoints of connections in an integrated circuit design. However, such a connectivity data structure may lack the interconnect routing information indicating the intermediate point(s) that a connection may traverse through. FIG. 6 illustrates an example of a routing data structure 600. Although routing data structure 600 is represented as a table in FIG. 6, it should be understood that the interconnect routing information provided by routing data structure 600 can be represented using a different form of data structure.

Routing data structure 600 can be used to indicate how separate chips of an integrated circuit design are interconnected with each other. As shown in FIG. 6, both the row and column headings of routing data structure 600 indicate an individual chip in the integrated circuit design. For example, the integrated circuit design may include n+1 number of chips SoC-0 to SoC-n. The individual cells of routing data structure 600 indicates the chip-to-chip connection used for data communications.

Referring to the row having SoC-0 as the source chip, SoC-0 does not transfer data with itself using a chip-to-chip connection, and thus this first cell is not populated. Referring to the next cells in this row, SoC-0 may transfer data with SoC-1 as the target chip using chip-to-chip connection S2S1, and with SoC-n as the target chip using chip-to-chip connection S2S3. Referring to the row having SoC-1 as the source chip, SoC-1 may transfer data with SoC-0 as the target chip using chip-to-chip connection S2S1, and with SoC-n as the target chip using chip-to-chip connection S2S4. Referring to the row having SoC-n as the source chip, SoC-n may transfer data with SoC-0 as the target chip using chip-to-chip connection S2S3, and with SoC-2 as the target chip using chip-to-chip connection S2S4. In implementations in which two chips are connected using multiple chip-to-chip connections, the corresponding cell entry may indicate more than one chip-to-chip connection.

Figure 7:
FIG. 7 illustrates an example of a routing data structure for interconnects, according to certain aspects of the disclosure.

While routing data structure 600 provides routing information for chip-to-chip connections, additional routing information within a chip may be needed to route data from a source port to a communication port corresponding to the chip-to-chip connection when transferring data to a different chip. FIG. 7 illustrates another example of a routing data structure 700, which can be used to indicate how communication ports within a chip can be routed to transfer data to a chip-to-chip connection to transfer data with another chip. Although routing data structure 700 is represented as a table in FIG. 7, it should be understood that the interconnect routing information provided by routing data structure 700 can be represented using a different form of data structure.

The example of routing data structure 700 shown in FIG. 7 indicates how data flow from source ports within a chip can be routed to chip-to-chip connection S2S0. In some implementations, each chip-to-chip connection may have its own routing data structure. In some implementations, the routing information for each chip-to-chip connection may can be combined into one routing data structure. As shown in FIG. 7, the row headings indicate source ports that are associated with functional circuit blocks (e.g., Cmp-0 to Cmp-n), and the column headings indicate interconnect ports (e.g., IC-0 to IC-n) that can transfer data on chip-to-chip connection S2S1. In some implementations, the source ports may also include interconnect ports.

By way of example, referring to the row having Cmp-0 as the source port, Cmp-0 can transfer data to another chip over chip-to-chip connection S2S1 via interconnect port IC-1. Hence, in order for Cmp-0 to transfer data to another chip over chip-to-chip connection S2S1, the data flow is first routed from Cmp-0 to IC-1, and then from IC-1 to chip-to-chip connection S2S1. As another example, referring to the row having Cmp-1 as the source port, Cmp-1 can transfer data to another chip over chip-to-chip connection S2S1 via interconnect port IC-0. Hence, in order for Cmp-1 to transfer data to another chip over chip-to-chip connection S2S1, the data flow is first routed from Cmp-1 to IC-0, and then from IC-0 to chip-to-chip connection S2S1. Similarly, as shown in routing data structure 700, Cmp-2 can transfer data to another chip over chip-to-chip connection S2S1 via interconnect port IC-1, Cmp-3 can transfer data to another chip over chip-to-chip connection S2S1 via interconnect port IC-2, and Cmp-n can transfer data to another chip over chip-to-chip connection S2S1 via interconnect port IC-3.

Using the combination of data structures such as data structures 500, 600, and 700, the endpoints and intermediate points of each connection for data communication in an integrated circuit design can be defined. However, to verify that the communication channels can support the data transmission bandwidth of the integrated circuit design, additional bandwidth information for each connection may be needed. FIG. 8 illustrates an example of a bandwidth data structure that can be used to indicate a communication bandwidth for each of the connections between the source ports and the target ports of the integrated circuit design. Although bandwidth data structure 800 is represented as a table in FIG. 8, it should be understood that the bandwidth information provided by bandwidth data structure 800 can be represented using a different form of data structure.

As shown in FIG. 8, the row and column headings of bandwidth data structure 800 are similar to those of connectivity data structure 600. Instead of indicating whether a connection from a source port to a target port is a valid connection as in connectivity data structure 600, bandwidth data structure 800 provides the communication bandwidth of each valid connection in the integrated circuit design. For example, referring to the row with Cmp-0 as the source, Cmp-0 may perform data transfer up to 20 GB/s with Cmp-2 as a target, and similarly up to 20 GB/s with Cmp-2 as the target. Referring to the row with Cmp-1 as the source, Cmp-1 may perform data transfer up to 10 GB/s with Cmp-0 as the target, up to 25 GB/s with Cmp-1 as the target, and 5 GB/s with IC-0 as the target. As another example, referring to the row with IC-0 as the source, IC-0 may perform data transfer up to 40 GB/s with Cmp-0 as the target, and similarly up to 40 GB/s with Cmp-1 as the target. It should also be noted that because of the structural similarities of connectivity data structure 600 and bandwidth data structure 800, the two data structures can be merged into one data structure in some implementations.

In some implementations, the communication bandwidth from a source port to a particular target port can be different depending on whether the particular target port is on the same chip or on a different chip. In such scenarios, cells representing connections that can be targets to both the same chip and a different chip may include two bandwidths. In other implementations, a flattened data structure similar to that described with reference to data structure 600 can be used to provide the two bandwidths in separate cells. Furthermore, in some implementations, a connection from a source port to a target port may utilize different bandwidths depending on whether the source port is reading data from the target port or writing data to the target port. In such scenarios, there can be two bandwidths provided in each valid cell indicating the write bandwidth and the read bandwidth. In some implementations, a write bandwidth data structure for write bandwidth, and a read bandwidth data structure for read bandwidth can be implemented, or the two data structures can be combined into a flattened data structure with separate cells for read and write bandwidths.

The combination of the connectivity data structure 500, routing data structures 600 and 700, and bandwidth data structure 800 provides the interconnect architecture of the integrated circuit design. Next, the bandwidth utilization of the communication channels of the integrated circuit design can be verified against bandwidth constraints to determine if the maximum bandwidth utilization can be supported. Because of the potentially complex interconnections and branches in the interconnect architecture of the integrated circuit design, the connections defined by the various data structures are transformed into a representation of an interconnect flow graph.

The interconnect flow graph can be generated by parsing the data structures to determine the communication ports that are used in the connections of the integrated circuit design. The communication ports may include source ports, target ports, and any intermediate ports used in the connections. By way of example, the row and column headings of connectivity data structure 500 and routing data structures 600 and 700 can be merged, and unique communication ports in the merged set may correspond to all the communication ports utilized in the connections of the integrated circuit design. It should be noted that the same communication port (e.g., Cmp-0) that are in different chips are considered to be different and unique communication ports in the overall integrated circuit design. Once the communication ports utilized by the connections defined in the integrated circuit design have been determined, a node can be generated for each communication port.

Each connection defined in connectivity data structure 500 can be processed to generate an edge between the nodes along the interconnect route of the corresponding connection. For example, for each connection from one chip to another chip defined in connectivity data structure 500, the source node of the connection can be referenced in routing data structure 700 to determine which intermediate interconnect port and which chip-to-chip connection port is used by the source port to transfer data to another chip. An edge connecting each leg of the datapath is added to the interconnect flow graph. Routing data structure 600 can then be referenced to connect edges between the chip-to-chip connection ports of the different chips. At the target chip end, a similar process can be performed to determine the connectivity from the chip-to-chip connection port to the target port, and an edge connecting each leg of the datapath at the target chip is added to the interconnect flow graph. For local connections within the same chip, an edge can be added between the source port and the local target port indicated in connectivity data structure 500.

Having connected the nodes with edges along a connection in the interconnect flow graph, the communication bandwidth of the connection is then determined by referencing bandwidth data structure 800. The communication bandwidth for the connection as indicated in bandwidth data structure 800 is then assigned to each edge along the interconnect route of the connection.

When all connections have been processed, a total bandwidth utilization of each node in the interconnect flow graph by adding the communication bandwidth of all incoming edges to the node. In some implementations, if there are multiple edges going from the same first node to the same second node, the multiple edges can be consolidated into one edge having a bandwidth equal to the total bandwidth of the multiple edges. The bandwidth utilization of the node can then be verified against a bandwidth constraint for that node to determine if the bandwidth utilization of the node according to the integrated circuit design is within the bandwidth constraint. It should be noted that as discussed above, certain connections may have different bandwidths for reads and writes. In such scenarios, a read bandwidth utilization and a write bandwidth utilization of a node can be computed, and each can be compared against their respective bandwidth constraints.

In some implementations, an information report containing bandwidth utilization of one or more nodes can be generated. For example, a verification report can be generated to include information indicating whether the bandwidth utilization of each node is within the bandwidth constraint of that node. For example, the verification report may include a report of every node in the interconnect flow graph along with the corresponding bandwidth utilization and/or bandwidth constraint. The verification report may include only the problematic nodes in the interconnect flow graph along with the corresponding bandwidth utilization, bandwidth constraint, and/or the amount of bandwidth that should be reduced on the node to meet the bandwidth constraint. In some implementations, the interconnect flow graph can also be queried by providing an identifier for the communication port to obtain bandwidth utilization and bandwidth constraint information for the node corresponding to the communication port.

If the integrated circuit design contains any problematic nodes, the interconnect architecture can be adjusted by rerouting certain connections or reducing bandwidth on certain connections to meet the bandwidth constraints. In some implementations, even if all the nodes are able to satisfy their respective bandwidth constraints, the interconnect architecture can still be adjusted based on the verification report, for example, to load balance the communication ports in the integrate circuit design. The verification process can be rerun after modifying the interconnect architecture to determine the effect of the adjustments.

Figure 9:
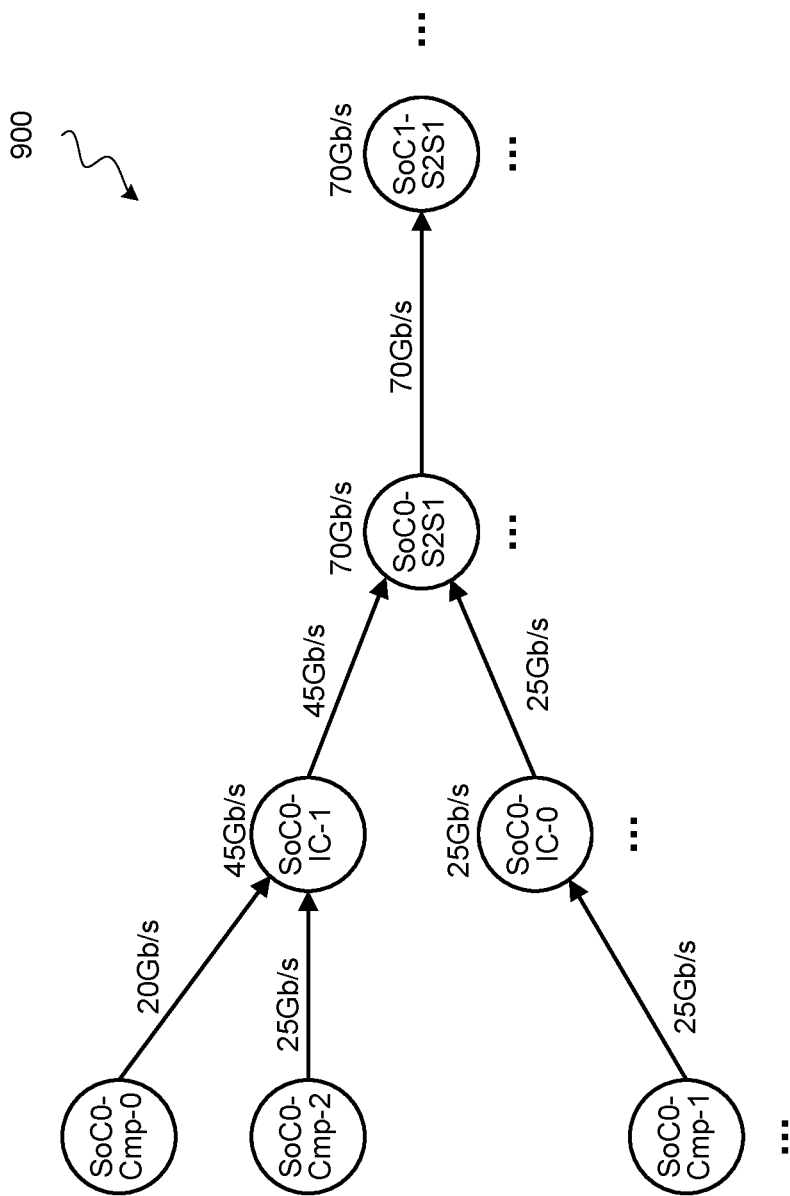
FIG. 9 illustrates an example of a representation of an interconnect flow graph, according to certain aspects of the disclosure.

FIG. 9 illustrates an example of a representation of an interconnect flow graph 900. The interconnect flow graph 900 can be represented graphically as shown, or can be represented using other data constructs such as pointers to variables, linked lists, or the like. For ease of explanation, interconnect flow graph 900 is shown as a partial flow graph and does not include every edge and every node of an integrated circuit design (e.g., local edges for connections within the same chip have been omitted). The partial connectivity shown in FIG. 9 illustrates the connections from source ports Cmp-0 to Cmp-3 of a first chip SoC0 to the chip-to-chip connection port SoC1-S2S0 of a second chip SoC1.

Referring to connectivity data structure 500 in FIG. 5, source port Cmp-0 has a connection to a target port Cmp-3 on another chip. Referring to routing data structure 600 in FIG. 6, SoC-0 transfers data with SoC-1 over the S2S1 chip-to-chip connection port. Referring to routing data structure 700 in FIG. 7, source port Cmp-0 connects to S2S1 chip-to-chip connection port via interconnect port IC-1. Referring to bandwidth data structure 800 in FIG. 8, the connection from source port Cmp-0 to target port Cmp-3 on another chip has a bandwidth of 20 GB/s. As such, interconnect flow graph 900 includes an edge having an assigned bandwidth of 20 GB/s from SoC0-Cmp-0 to SoC0-IC-1, and from SoC0-IC-1 to SoC0-S2S1.

Similarly, referring to connectivity data structure 500 in FIG. 5, source port Cmp-1 has a connection to a target port Cmp-1 on another chip. Referring to routing data structure 600 in FIG. 6, SoC-0 transfers data with SoC-1 over the S2S1 chip-to-chip connection port. Referring to routing data structure 700 in FIG. 7, source port Cmp-1 connects to S2S1 chip-to-chip connection port via interconnect port IC-0. Referring to bandwidth data structure 800 in FIG. 8, the connection from source port Cmp-1 to target port Cmp-1 on another chip has a bandwidth of 25 GB/s. As such, interconnect flow graph 900 includes an edge having an assigned bandwidth of 25 GB/s from SoC0-Cmp-1 to SoC0-IC-0, and from SoC0-IC-0 to SoC0-S2S1.

Referring again to connectivity data structure 500 in FIG. 5, source port Cmp-2 has a connection to a target port Cmp-2 on another chip. Referring to routing data structure 600 in FIG. 6, SoC-0 transfers data with SoC-1 over the S2S1 chip-to-chip connection port. Referring to routing data structure 700 in FIG. 7, source port Cmp-2 connects to S2S1 chip-to-chip connection port via interconnect port IC-0. Referring to bandwidth data structure 800 in FIG. 8, the connection from source port Cmp-2 to target port Cmp-2 on another chip has a bandwidth of 25 GB/s. As such, interconnect flow graph 900 includes an edge having an assigned bandwidth of 25 GB/s from SoC0-Cmp-2 to SoC0-IC-0, and from SoC0-IC-0 to SoC0-S2S1. The two edges having respective bandwidths of 20 GB/s and 25 GB/s from SoC0-IC-0 to SoC0-S2S1 can be consolidated into a one edge having a bandwidth of 45 GB/s as shown in FIG. 9.

Assuming that these are all the connections that need to be processed, the bandwidth utilization of each node can be computed as the sum of the bandwidths of all incoming edges to that node. For example, SoC0-IC-1 has a bandwidth utilization of 45 GB/s, and SoC0-S2S1 has a bandwidth utilization of 70 GB/s. The bandwidth utilization of each node can be compared against respective bandwidth constraints to determine if the corresponding communication port can support the bandwidth utilization of the integrated circuit design.

Figure 10:
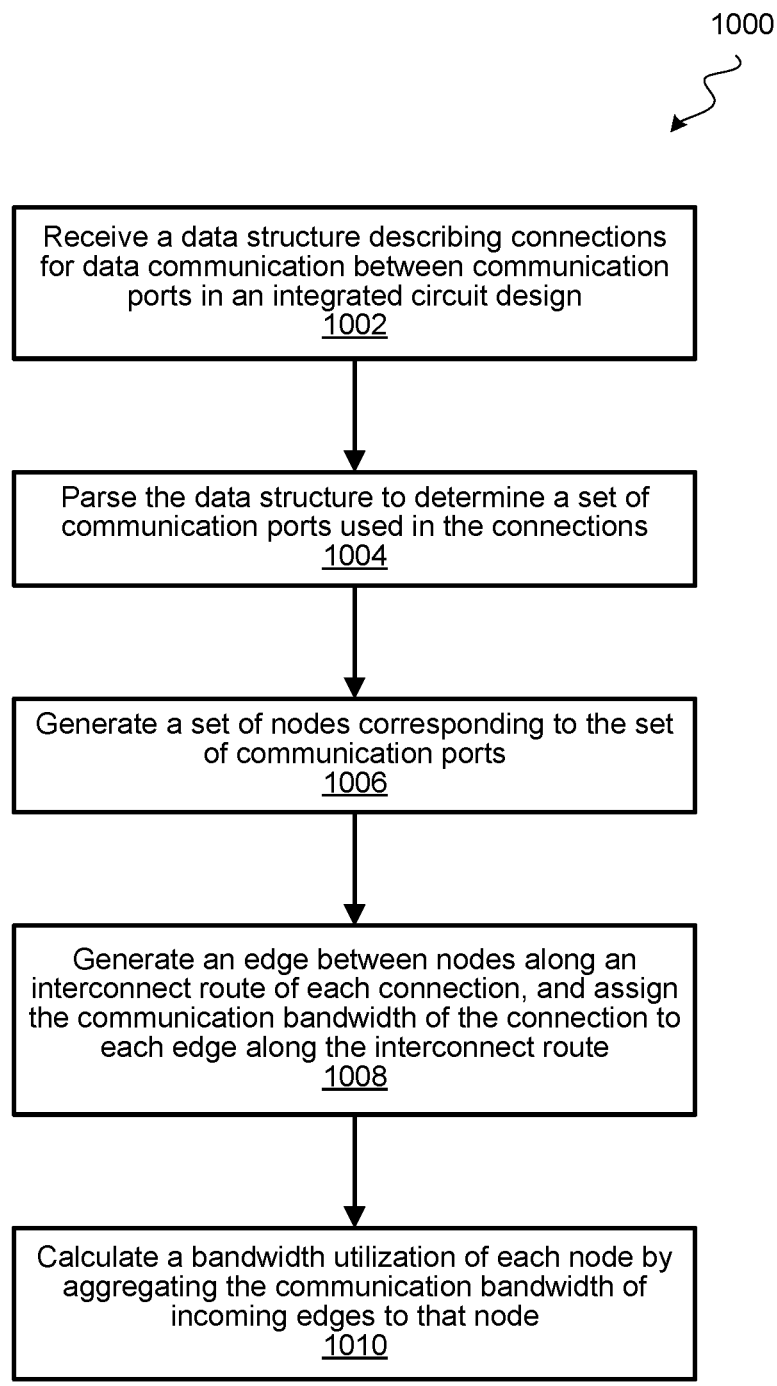
FIG. 10 illustrates a flow diagram of an example of a process for verifying data communication bandwidth of an integrated circuit design, according to certain aspects of the disclosure.

FIG. 10 illustrates a flow diagram of an example of a process 1000 for verifying communication channel bandwidth in an integrated circuit design, according to some implementations. Process 1000 can be implemented, for example, using software such as code stored in a computer readable storage medium. Process 1000 can be implemented as an electronic design automation tool or part of such tool. In some implementations, process 1000 can be used to verify single-chip designs or multi-chip designs. For multi-chip designs, the multiple chips may communicate with each other using chip-to-chip connection ports (e.g., southbridge ports, peripheral component interconnect (PCI) ports, computer express link (CXL) ports, cache coherent interconnect for accelerators (CCIX) ports, chip to chip link (C2C) ports, or other suitable communication ports for connecting chips communication with each other). The multiple chips can include symmetric and/or asymmetric chips. The multiple chips can also include multiple system-on-chips.

Process 1000 may begin at block 1002 by receiving a data structure describing connections for data communication between communication ports in the integrated circuit design. The data structure may include one or more data structures that indicate for each connection, interconnect routing information for the connection, and a communication bandwidth for the connection. The interconnect routing information may include a source port, a target port, and any intermediate port of the connection. Examples of source and target ports may include communication ports associated with a functional circuit block such as processor communication ports, accelerator communication ports, system memory ports, network interface ports, peripheral communication ports, interconnect ports, chip-to-chip connection ports, etc. Examples of intermediate ports may include interconnect ports, chip-to-chip connection ports, etc.

In some implementations, the data structure can include a connectivity table indicating a source port and a target port of each connection. The connectivity table can include information indicating whether the target port is on the same local chip as the source port, on another chip, or both. The data structure can include a routing table indicating the chip-to-chip connection ports used to communicate data between different chips. The data structure can include a routing table indicating the chip-to-chip connection ports used to communicate data between different chips. The data structure can also include a set of interconnect routing tables each corresponding to a chip-to-chip connection port, and each interconnect routing table may indicate a mapping of source ports to intermediate ports that connect to the corresponding chip-to-chip connection port. The data structure can also include a bandwidth table indicating the desired bandwidth of each connection. In some implementations, one or more tables can be combined into a single table, or be implemented using one or more spreadsheets. In some implementations, the information provided by the tables can also be represented using other types of data structures.

At block 1004, process 1000 can parse the data structure to determine a set of communication ports used in the connections of the integrated circuit design. For example, in implementations in which the data structure is implemented using tables, the row and column headings of the tables can be parsed to determine the communication ports of the integrated circuit design. It should be noted that in a multi-chip design, multiple chips may have the same set of communication ports. Common ports that are in multiple chips are considered separate and individual communication ports in the set of communication ports. Communication ports that are not involved in any of the connections can be omitted from the set of communication ports.

At block 1006, process 1000 generates a set of nodes corresponding to the set of communication ports. The set of nodes includes only unique communication ports of the integrated circuit design. For example, a communication port of one chip can be involved in multiple connections, but only one node is generated for the communication port. As mentioned above, the same communication port in different chips are considered unique communication ports, and separate nodes are generated for such ports.

At block 1008, process 1000 generates an edge between nodes along an interconnect route of each connection, and assigns the communication bandwidth of the connection to each edge along the interconnect route. The interconnect route of a connection can be determined by referencing the data structure (e.g., connectivity table, routing tables, etc.) to determine the source port, any intermediate ports, and the target port of the connection. Edges can be added to link the nodes corresponding to the source, intermediate (if any), and target ports along the connection. The bandwidth of the connection can be determined by referencing, for example, the bandwidth table.

At block 1010, process 1000 can calculate a bandwidth utilization of each node in the set of nodes by aggregating or adding the communication bandwidth of incoming edges to the node. In some implementations, multiple edges going from the same first node to the same second node can be consolidated into a single edge with a communication bandwidth being the sum of the multiple edges. The calculated bandwidth utilization of a node represents the amount of bandwidth that the communication port represented by the node should support according to the integrated circuit design. The bandwidth utilization of each node can be compared with a bandwidth constraint (e.g., maximum allowable bandwidth) for the corresponding node to determine whether the communication port can support the bandwidth of the design.

In some implementations, the integrated circuit design may have separate read and write bandwidths for a connection. In such implementations, blocks 1008 and 1010 can be repeated for the read bandwidths and the write bandwidths. In some implementations, an information message containing bandwidth utilization information of a node can be generated. For example, an error message can be generated when the bandwidth utilization of a node exceeds the bandwidth constraint for that node, and an integrated circuit designer can take corrective actions to reallocate or reduce the data communication bandwidth of the problematic communication channels such that the design can operate within the bandwidth constraints.

In addition to verifying that the bandwidth utilization of nodes in the integrated circuit design are within their constraints, the techniques disclosed herein can also be used to perform other types of analysis or chip design improvement such as optimizing the interconnect routing of the integrated circuit design. For example, the bandwidth utilizations of the nodes can be optimized by redistributing and re-routing some of the communication bandwidth from heavily loaded nodes to less utilized nodes. By generating an interconnect flow graph for the integrated circuit design, different routing options can be readily explored to find the optimal interconnect routes for the integrated circuit design.

Figure 11:
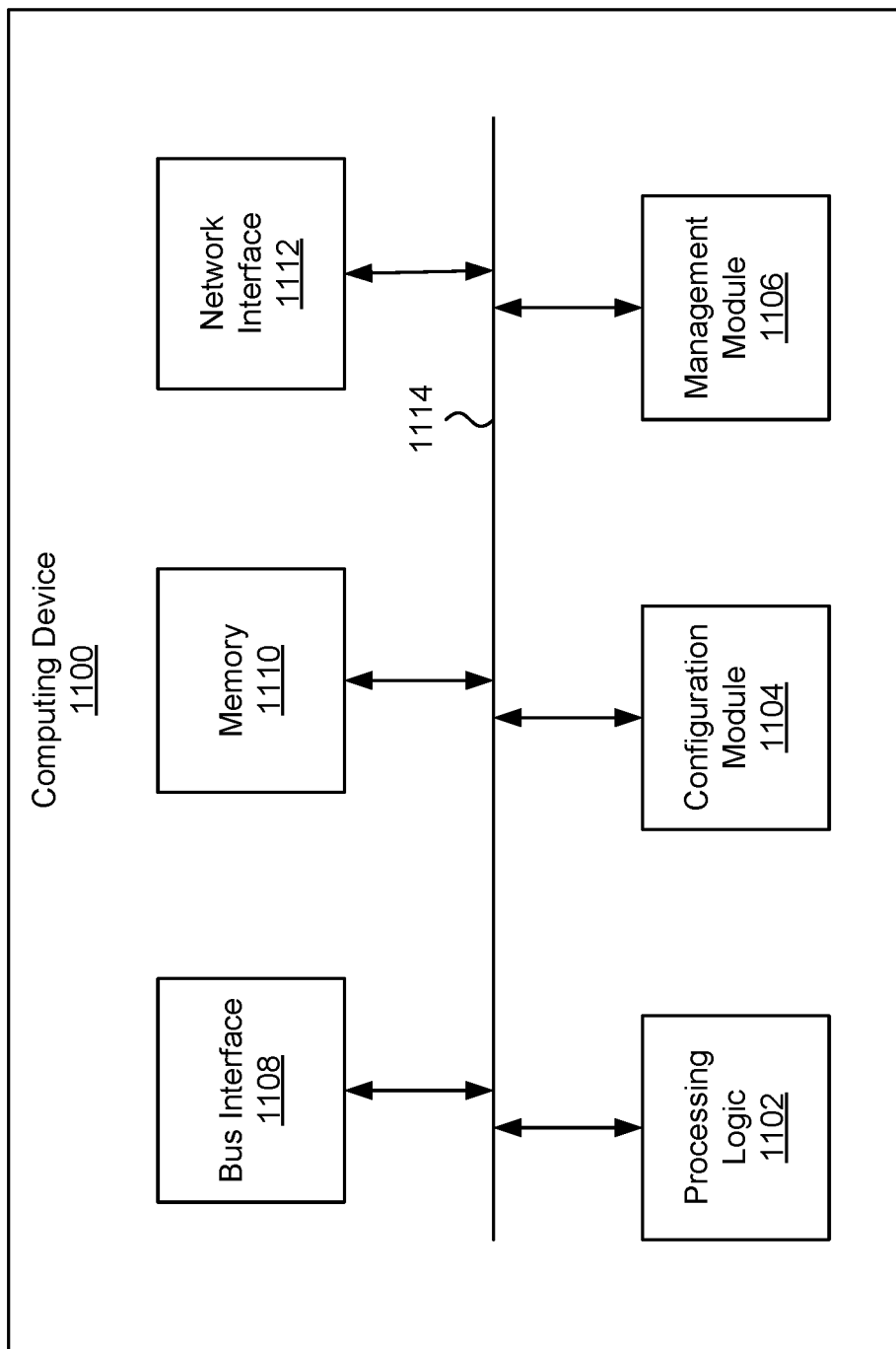
FIG. 11 illustrates an example of a network device, according to certain aspects of the disclosure.

FIG. 11 illustrates an example of a computing device 1100. In some implementations, computing device 1100 can be used to execute process 1000 to verify an integrated circuit design. In one example, the computing device 1100 may include processing logic 1102, a configuration module 1104, a management module 1106, a bus interface module 1108, memory 1110, and a network interface module 1112. These modules may be hardware modules, software modules, or a combination of hardware and software. In certain instances, modules may be interchangeably used with components or engines, without deviating from the scope of the disclosure. The computing device 1100 may include additional modules, not illustrated here. In some implementations, the computing device 1100 may include fewer modules. In some implementations, one or more of the modules may be combined into one module. One or more of the modules may be in communication with each other over a communication channel 1114. The communication channel 1114 may include one or more busses, meshes, matrices, fabrics, a combination of these communication channels, or some other suitable communication channel.

The processing logic 1102 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1102 may include processors developed by ARM®, MIPS®, AMID®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1102 may be stored on a computer-readable storage medium, for example, in the form of a computer program. The computer-readable storage medium may be non-transitory. In some cases, the computer-readable medium may be part of the memory 1110.

The memory 1110 may include either volatile or non-volatile, or both volatile and non-volatile types of memory. The memory 1110 may, for example, include random access memory (RAM), read only memory (ROM), Electrically Erasable Programmable Read-Only Memory (EEPROM), flash memory, and/or some other suitable storage media. In some cases, some or all of the memory 1110 may be internal to the computing device 1100, while in other cases some or all of the memory may be external to the computing device 1100. The memory 1110 may store an operating system comprising executable instructions that, when executed by the processing logic 1102, provides the execution environment for executing instructions providing networking functionality for the computing device 1100. The memory may also store and maintain several data structures and routing tables for facilitating the functionality of the computing device 1100.

In some implementations, the configuration module 1104 may include one or more configuration registers. Configuration registers may control the operations of the computing device 1100. In some implementations, one or more bits in the configuration register can represent certain capabilities of the computing device 1100. Configuration registers may be programmed by instructions executing in the processing logic 1102, and/or by an external entity, such as a host device, an operating system executing on a host device, and/or a remote device. The configuration module 1104 may further include hardware and/or software that control the operations of the computing device 1100.

In some implementations, the management module 1106 may be configured to manage different components of the computing device 1100. In some cases, the management module 1106 may configure one or more bits in one or more configuration registers at power up, to enable or disable certain capabilities of the computing device 1100. In certain implementations, the management module 1106 may use processing resources from the processing logic 1102. In other implementations, the management module 1106 may have processing logic similar to the processing logic 1102, but segmented away or implemented on a different power plane than the processing logic 1102.

The bus interface module 1108 may enable communication with external entities, such as a host device and/or other components in a computing system, over an external communication medium. The bus interface module 1108 may include a physical interface for connecting to a cable, socket, port, or other connection to the external communication medium. The bus interface module 1108 may further include hardware and/or software to manage incoming and outgoing transactions. The bus interface module 1108 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1108 may include the physical layer for any of these bus protocols, including a connector, power management, and error handling, among other things. In some implementations, the computing device 1100 may include multiple bus interface modules for communicating with multiple external entities. These multiple bus interface modules may implement the same local bus protocol, different local bus protocols, or a combination of the same and different bus protocols.

The network interface module 1112 may include hardware and/or software for communicating with a network. This network interface module 1112 may, for example, include physical connectors or physical ports for wired connection to a network, and/or antennas for wireless communication to a network. The network interface module 1112 may further include hardware and/or software configured to implement a network protocol stack. The network interface module 1112 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 1100 may include multiple network interface modules, each configured to communicate with a different network. For example, in these implementations, the computing device 1100 may include a network interface module for communicating with a wired Ethernet network, a wireless 802.11 network, a cellular network, an Infiniband network, etc.

The various components and modules of the computing device 1100, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 11, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computer-implemented method for verifying interconnect bandwidth in an integrated circuit design having multiple system-on-chip (SoC) devices, the method comprising:
   receiving a connectivity data structure indicating connections for data communication between source ports and target ports of the integrated circuit design;
   receiving a routing data structure indicating an interconnect route for each of the connections of the integrated circuit design, the routing data structure including mappings of connections routed via chip-to-chip connection ports;
   receiving a bandwidth data structure indicating a communication bandwidth for each of the connections between the source ports and the target ports of the integrated circuit design;
   generating a representation of an interconnect flow graph by:
      generating a node for each communication port used in the connections of the integrated circuit design; and
      for each of the connections, generating an edge between nodes along the interconnect route of the corresponding connection, and assigning the communication bandwidth of the corresponding connection to each edge along the interconnect route; and
   for each of the nodes in the interconnect flow graph:
      calculating a bandwidth utilization by adding the communication bandwidth of all incoming edges to the node; and
      verifying that the bandwidth utilization of the node is within a bandwidth constraint of the node.

2. The computer-implemented method of claim 1, further comprising generating an information report that includes bandwidth utilization information of one or more of the nodes.

3. The computer-implemented method of claim 1, wherein the source ports include one or more of a processor communication port, an accelerator communication port, a system memory port, a network interface port, a peripheral communication port, an interconnect port, or a chip-to-chip connection port.

4. The computer-implemented method of claim 1, wherein the connections include a first connection and a second connection, and wherein the first connection has a source port that is a target port of the second connection.

5. A computer-implemented method, comprising:
   receiving a data structure indicating, for each connection of a plurality of connections for data communication between communication ports of functional circuit blocks in an integrated circuit design:
      interconnect routing information for the connection; and
      a communication bandwidth for the connection,
   wherein the data structure includes mappings of connections routed via chip-to-chip connection ports;
   parsing the data structure to determine a set of communication ports used in the plurality of connections;
   generating a representation of an interconnect flow graph based on the data structure by:
      generating a set of nodes corresponding to the set of communication ports; and
      for each connection in the plurality of connections, generating an edge between nodes along an interconnect route of the connection, and assigning the communication bandwidth of the connection to each edge along the interconnect route; and
   for each node in the set of nodes, calculating a bandwidth utilization of the node by aggregating the communication bandwidth of incoming edges to the node, and determining whether the bandwidth utilization of the node is within a bandwidth constraint of the node.

6. The computer-implemented method of claim 5, further comprising generating an information message containing bandwidth utilization information of a node.

7. The computer-implemented method of claim 5, wherein the communication bandwidth of a connection includes a write bandwidth and a read bandwidth.

8. The computer-implemented method of claim 5, wherein the data structure includes a connectivity table indicating a source port and a target port of each connection.

9. The computer-implemented method of claim 8, wherein the connectivity table further includes information indicating whether the target port is on a same chip as the source port or on a different chip.

10. The computer-implemented method of claim 5, wherein the set of nodes includes a subset of nodes representing the chip-to-chip connection ports used for data communication between two or more chips.

11. The computer-implemented method of claim 10, wherein the chip-to-chip connection ports include a southbridge port, a peripheral component interconnect port, a computer express link (CXL) port, a cache coherent interconnect for accelerators (CCIX) port, or a chip-to-chip link (C2C) port.

12. The computer-implemented method of claim 10, wherein the two or more chips include two symmetrical chips.

13. The computer-implemented method of claim 10, wherein the two or more chips include two asymmetrical chips.

14. The computer-implemented method of claim 10, wherein the two or more chips include two system-on-chips.

15. A non-transitory computer-readable medium having stored therein code that, when executed by one or more processors, causes the one or more processors to perform operations including:
   receiving a data structure describing a plurality of connections for data communication between communication ports of functional circuit blocks in an integrated circuit design, wherein the data structure includes mappings of connections routed via chip-to-chip connection ports;
   parsing the data structure to determine a set of communication ports used in the plurality of connections;
   generating a representation of an interconnect flow graph based on the data structure by
      generating a set of nodes corresponding to the set of communication ports; and
      for each connection in the plurality of connections, generating an edge between nodes along an interconnect route of the connection, and assigning a communication bandwidth of the connection to each edge along the interconnect route; and
   for each node in the set of nodes, calculating a bandwidth utilization of the node by aggregating the communication bandwidth of incoming edges to the node, and determining whether the bandwidth utilization of the node is within a bandwidth constraint of the node.

16. The non-transitory computer-readable medium of claim 15, wherein the operations further include generating an information report that contains bandwidth utilization information of one or more of the nodes.

17. The non-transitory computer-readable medium of claim 15, wherein the set of nodes includes a subset of nodes representing the chip-to-chip connection ports used for data communication between two or more chips.

18. The non-transitory computer-readable medium of claim 15, wherein the data structure includes an interconnect routing table.

* * * * *